United States Patent
Moon et al.

(10) Patent No.: US 8,502,446 B2
(45) Date of Patent: Aug. 6, 2013

(54) ORGANIC LIGHT EMITTING DIODE DISPLAY

(75) Inventors: Chan-Kyoung Moon, Suwon-si (KR); Kuen-Dong Ha, Suwon-si (KR); Ji-Ho Kang, Suwon-si (KR); Hyun-Hee Lee, Suwon-si (KR); Dong-Su Yee, Suwon-si (KR); Jung-Jun Im, Suwon-si (KR); Oh-June Kwon, Suwon-si (KR); Hyun-Min Hwang, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1155 days.

(21) Appl. No.: 12/318,858

(22) Filed: Jan. 9, 2009

(65) Prior Publication Data

US 2009/0195485 A1   Aug. 6, 2009

(30) Foreign Application Priority Data

Jan. 14, 2008  (KR) ........................ 10-2008-0003940

(51) Int. Cl.
*G09G 3/30*   (2006.01)
(52) U.S. Cl.
USPC ......................................... 313/506; 313/512
(58) Field of Classification Search
USPC ................................. 313/495–512
See application file for complete search history.

(56) References Cited

U.S. PATENT DOCUMENTS

| | | | |
|---|---|---|---|
| 2003/0080678 A1* | 5/2003 | Kim et al. | 313/504 |
| 2006/0017369 A1* | 1/2006 | Niibori et al. | 313/495 |
| 2007/0103617 A1* | 5/2007 | Kitajima et al. | 349/58 |
| 2007/0241664 A1* | 10/2007 | Sakamoto et al. | 313/503 |
| 2008/0011513 A1* | 1/2008 | Kamps et al. | 174/565 |

FOREIGN PATENT DOCUMENTS

| | | | |
|---|---|---|---|
| KR | 10-0023673 | * | 3/2006 |
| KR | 20060023673 A | | 3/2006 |
| KR | 10-0681604 | | 2/2007 |
| KR | 0769425 B1 | | 10/2007 |

* cited by examiner

*Primary Examiner* — Anh Mai
*Assistant Examiner* — Elmito Breval
(74) *Attorney, Agent, or Firm* — Robert E. Bushnell, Esq.

(57) ABSTRACT

An OLED display that is enhanced in mechanical strength by improving a structure of a bezel supporting a panel assembly. The OLED display includes a panel assembly that includes a display region, a pad region, and a plurality of OLEDs arranged in the display region and a bezel coupled to the panel assembly, the bezel including synthetic resin, wherein, when a diagonal length of the display region is in the range of 25.4 to 101.6 mm, the bezel being designed to satisfy the following inequality $t \geq 0.0003 \times a$, where t(mm) is a thickness of the bezel and a(mm$^2$) is an area of the display region.

20 Claims, 3 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on Jan. 14, 2008 and there duly assigned Serial No. 10-2008-0003940.

BACKGROUND OF THE INVENTION

1. Field of the Invention

The present invention relates to an organic light emitting diode (OLED) display that is enhanced in mechanical strength by improving the design of a bezel used to support a panel assembly.

2. Description of the Related Art

An OLED display includes a plurality of organic light emitting diodes (OLEDs), each diode having a hole injection electrode, an organic light emitting layer, and an electron injection electrode. The OLEDs emit light using energy generated when excitons produced by electron-hole combination in the organic light emitting layer drop from the excitation state to the ground state.

By the above principle, the OLED displays have a self-emissive characteristic. Therefore, unlike liquid crystal displays (LCDs), the OLED displays do not require a separate light source and thus a thickness and weight thereof can be reduced. Further, the OLED displays have a variety of beneficial properties such as low power consumption, high luminance, quick response, and the like. Therefore, the OLED displays are drawing attention as the upcoming alternative displays for portable electronic devices.

Generally, a typical OLED display includes a panel assembly in which OLEDs are formed, a bezel coupled to the panel assembly at a rear side of the panel assembly, and a printed circuit board (PCB) electrically connected to the panel assembly by a flexible printed circuit board (FPCB). The panel assembly of the OLED display has two thin substrates. In addition, unlike the LCD in which the interior of a panel assembly is filled with liquid crystal, the OLED display is designed such that empty spaces exist in an inside of the panel assembly. Therefore, mechanical strength of the OLED display is not sufficient. Particularly, a drop impact resistance property of the panel assembly deteriorates with an increase in the size of the panel assembly.

Therefore, when a user accidentally drops an electronic device having the OLED display, a relatively large torsion load and/or relatively large bending load is applied to the bezel and thus the bezel is deformed. As a result, the torsion load and/or the bending load are transferred to the panel assembly coupled to the bezel. This can cause the damage of the panel assembly. What is therefore needed is a design for an OLED display that is better able to withstand impact.

The above information disclosed in this Background section is only for enhancement of understanding of the background of the invention and therefore it may contain information that is not prior art as per 35 U.S.C. 102.

SUMMARY OF THE INVENTION

An exemplary embodiment of the present invention provides an OLED display that is enhanced in mechanical strength and in drop impact resistance characteristic by improving a design of the bezel coupled to a panel assembly.

According to an exemplary embodiment of the present invention, an organic light emitting diode (OLED) display includes a panel assembly that includes a display region, a pad region, and a plurality of OLEDs arranged in the display region and a bezel coupled to the panel assembly, the bezel including synthetic resin, wherein, when a diagonal length of the display region is in the range of 25.4 to 101.6 mm, the bezel being designed to satisfy the following inequality $t \geqq 0.0003 \times a$, where t(mm) is a thickness of the bezel and a(mm$^2$) is an area of the display region.

The diagonal length of the display region can be 45.72 mm and the thickness of the bezel can be between 0.3 and 1 mm. The diagonal length of the display region can be 55.88 mm and the thickness of the bezel can be between 0.45 and 1.2 mm. The diagonal length of the display region can be 71.12 mm and the thickness of the bezel can be between 0.73 and 1.5 mm. The diagonal length of the display region can be 76.2 mm and the thickness of the bezel can be between 0.84 and 1.8 mm. The diagonal length of the display region can be 88.9 mm and the thickness of the bezel can be between 1.14 and 2 mm. The diagonal length of the display region can be 99.06 mm and the thickness of the bezel can be between 1.41 and 2.5 mm.

The bezel can include a bottom portion, the panel assembly being arranged on the bottom portion and sidewalls arranged on side edges of the bottom portion except for a side edge corresponding to the pad region. The display can also include a flexible printed circuit board fixed to the pad region and bent toward a rear surface of the bezel and a printed circuit board electrically connected to the panel assembly by the flexible printed circuit board.

According to another aspect of the present invention, there is provided an organic light 9 emitting diode (OLED) display that includes a panel assembly including a display region, a pad region, and a plurality of OLEDs arranged in the display region and a bezel coupled to the panel assembly, the bezel including synthetic resin, wherein, when a diagonal length of the display region is in the range of 101.6 to 177.8 mm, the bezel is designed to satisfy the following inequality: $t \geqq 0.00024 \times a$, where t(mm) is a thickness of the bezel and a(mm$^2$) is an area of the display region.

The diagonal length of the display region can be 101.6 mm and the thickness of the bezel can be between 1.1.9 and 3 mm. The diagonal length of the display region can be 127 mm and the thickness of the bezel can be between 1.86 and 4 mm. The diagonal length of the display region can be 152.4 mm and the thickness of the bezel can be between 2.67 and 5 mm. The bezel can include a bottom portion, the panel assembly being arranged on the bottom portion and sidewalls arranged on side edges of the bottom portion except for a side edge corresponding to the pad region. The OLED display can also include a flexible printed circuit board fixed to the pad region and bent toward a rear surface of the bezel and a printed circuit board electrically connected to the panel assembly by the flexible printed circuit board.

According to still another aspect of the present invention, there is provided an organic light emitting diode (OLED) display that includes a panel assembly that includes a display region, a pad region, and a plurality of OLEDs arranged in the display region and a bezel coupled to the panel assembly, the bezel including synthetic resin, wherein, when a diagonal length of the display region at least 177.8 mm, the bezel is designed to satisfy the following inequality: $t \geqq 0.00015 \times a$, where t(mm) is a thickness of the bezel and a(mm$^2$) is an area of the display region.

The diagonal length of the display region can be 177.8 mm and the thickness of the bezel can be between 2.27 and 5 mm.

The diagonal length of the display region can be 203.2 mm and the thickness of the bezel can be between 2.97 and 6 mm. The bezel can include a bottom portion, the panel assembly being arranged on the bottom portion and sidewalls arranged on side edges of the bottom portion except for a side edge corresponding to the pad region. The OLED display can also include a flexible printed circuit board fixed to the pad region and bent toward a rear surface of the bezel and a printed circuit board electrically connected to the panel assembly by the flexible printed circuit board.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments can be modified in various different ways, all without departing from the spirit or scope of the present invention.

Figure 1:
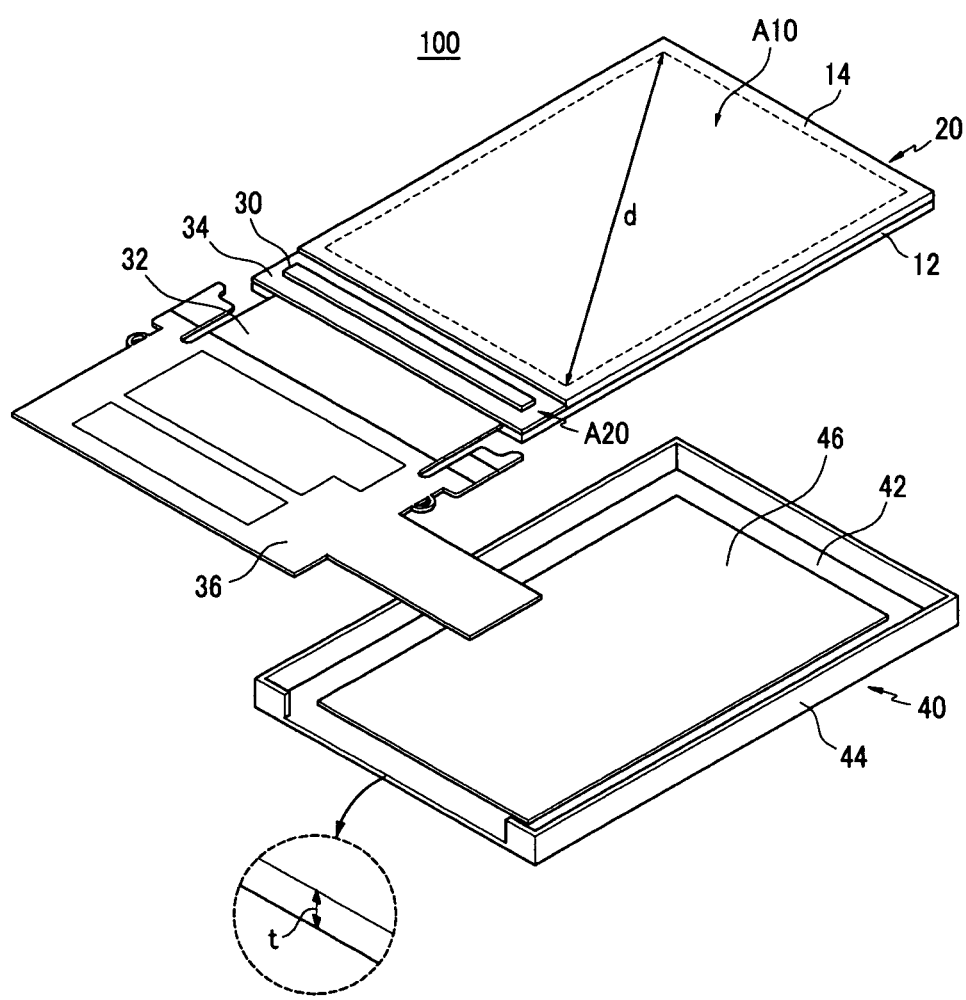
FIG. 1 is an exploded perspective view of an unassembled OLED display according to an exemplary embodiment of the present invention.
Figure 2:
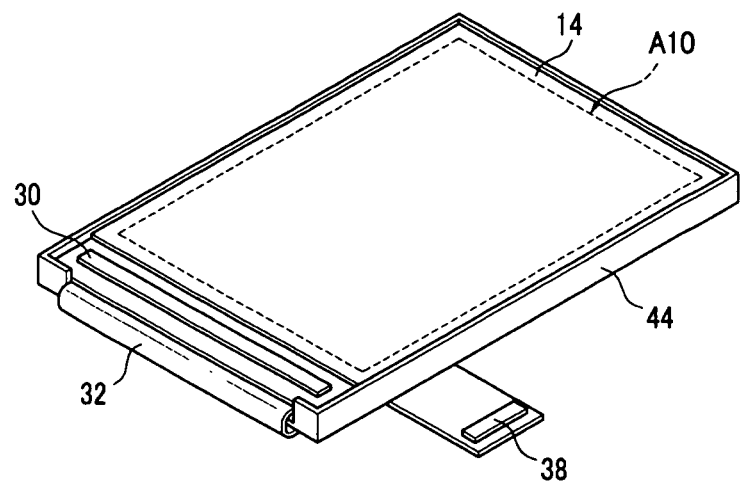
FIG. 2 is a perspective view of the OLED display of FIG. 1 upon assembly.

Turning now to FIGS. 1 and 2, FIG. 1 is an exploded perspective view of an unassembled OLED display according to an exemplary embodiment of the present invention, and FIG. 2 is a perspective view of the OLED display of FIG. 1 after assembly. Referring to FIGS. 1 and 2, an OLED display 100 of the present exemplary embodiment includes a panel assembly 20 having a display region A10 and a pad region A20 and displaying an image on the display region A10, a bezel 40 coupled to the panel assembly 20 at a rear side of the panel assembly 20 and a printed circuit board (PCB) 36 electrically connected to the panel assembly 20 via a flexible printed circuit board (FPCB) 32.

The panel assembly 20 includes a first substrate 12 and a second substrate 14 that is smaller than the first substrate 12 and has a peripheral portion coupled to the first substrate 12 by a sealant. The display region A10 is defined at an overlapping region of the first and second substrates 12 and 14, the display region A10 being surrounded by the sealant. The pad region A20 is defined at an outside of the sealant.

A plurality of sub-pixels are arranged in a matrix pattern in the display region A10 on the first substrate 12. Scan and data drivers (not shown) for driving the sub-pixels are located between the display region A10 and the sealant or at the outside of the sealant. Pad electrodes (not shown) for transferring electrical signals to the scan and data drivers are located in the pad region A20 of the first substrate 12.

Figure 3:
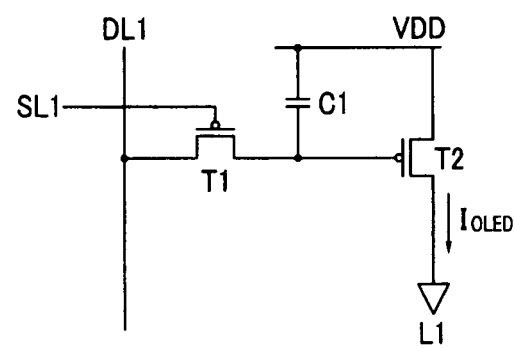
FIG. 3 is a circuit diagram of a sub-pixel circuit of the panel assembly of FIG. 1.
Figure 4:
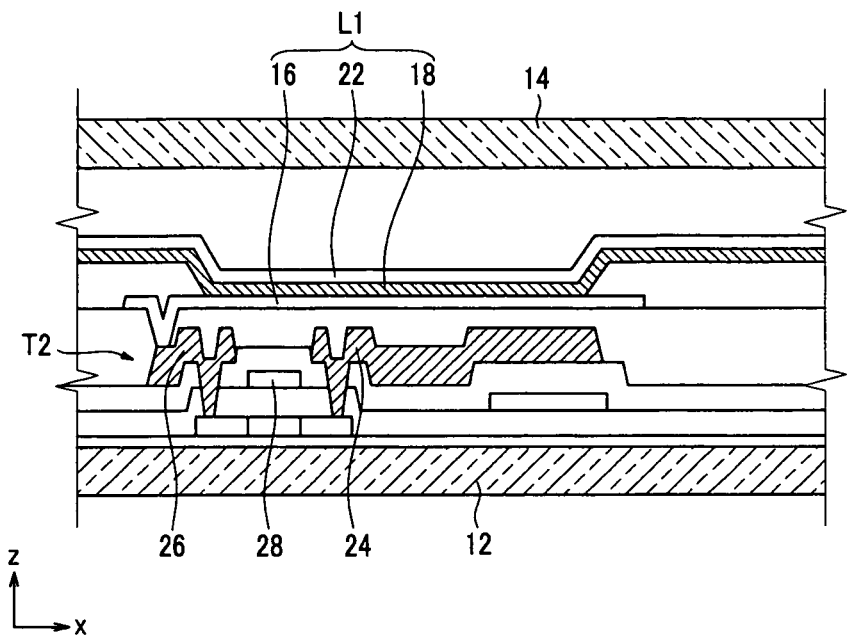
FIG. 4 is a partly enlarged cross-sectional view of the panel assembly of FIG. 1.

Turning now to FIGS. 3 and 4, FIG. 3 is a circuit diagram of a sub-pixel circuit of the panel assembly of FIG. 1, and FIG. 4 is a partly enlarged cross-sectional view of a panel assembly of FIG. 1. Referring to FIGS. 3 and 4, each of the sub-pixels of the panel assembly 20 includes an OLED L1 and a driving circuit unit. The OLED L1 includes an anode electrode 16, an organic light emitting layer 18, and a cathode electrode 22. The driving circuit unit includes at least two thin film transistors and at least one storage capacitor C1. The thin film transistors include at least one switching transistor T1 and at least one driving transistor T2.

The switching transistor T1 is connected to scan and data lines SL1 and DL1. Depending on the voltage inputted from the scan line SL1, the switching transistor T1 transfers data coming from data line DL1 to the driving transistor T2. The storage capacitor C1 is connected to a power line VDD as well as to the switching transistor T1 to store a voltage corresponding to a difference between a voltage transferred by the switching transistor T1 and a voltage supplied by the power line VDD.

The driving transistor T2 is connected to both the power line VDD and the storage capacitor C1 and supplies an output current $I_{OLED}$ to OLED diode L1. Current $I_{OLED}$ corresponds to a square of a difference between a voltage stored in storage capacitor C1 and a threshold voltage, and causes OLED diode L1 to emit light accordingly. The driving transistor T2 includes a source electrode 24, a drain electrode 26, and a gate electrode 28. The anode electrode 16 of the OLED L1 is connected to the drain electrode 26 of the driving transistor T2. It should be construed that the above-described structure of the sub-pixels is just an example and the present invention is in no way so limited.

Referring again to FIGS. 1 and 2, the second substrate 14 is coupled to the first substrate 12 by the sealant at a predetermined interval to protect the driving circuit unit and the OLEDs on the first substrate 12 from an outer environment. A polarizing plate (not shown) for suppressing reflection of external light can be arranged on an outer surface of the second substrate 14 in the display region A10. A moisture absorption agent can be attached to an inner surface of the second substrate 14.

An integrated circuit chip 30 is mounted in the pad region A20 of the panel assembly 20 through a chip-on-glass (COG) method. The FPCB 32 is also mounted in the pad region A20 of the panel assembly 20 through a chip-on-film (COF) method. A protective layer 34 is formed around the integrated circuit chip 30 and the FPCB 32 to cover and protect pad electrodes formed in the pad region A20.

A variety of electronic elements (not shown) for processing driving signals are mounted on the PCB 36. A connector 38, for transferring external signals to the PCB 36, is also installed on the PCB 36. The FPCB 32 fixed at the pad region A20 is folded toward a rear surface of the bezel 40 to face the rear surface of the bezel 40.

The bezel 40 includes a bottom portion 42 on which the panel assembly 20 is arranged and sidewalls 44, which extends from three of the four side edges. On the one remaining side edge of bezel 40, there is no sidewall. It is at this side edge that the FPCB 32 is bent around to face a rear surface of the bezel 40. A double-sided adhesive tape 46 is disposed between the bottom portion 42 of the bezel 40 and the panel assembly 20 to fix the panel assembly 20 to the bezel 40. It should be construed that the above-described structure for the bezel 40 is just an example and can be variously modified and still be within the scope of the present invention. For example, a flange (not shown) for enhancing strength can be formed on the side edge of the bottom portion 42, at which the FPCB 32 is bent.

In the present exemplary embodiment, the bezel 40 is made out of synthetic resin having an excellent impact absorption/dispersion property. For example, the bezel 40 can be made out of polymer-based engineering plastic such as polycarbonate. Although the strength of the synthetic resin is less than that of metal, an impact absorption/dispersion property of the synthetic resin is better than that of the metal. Therefore, when the OLED display 100 uses the bezel 40 made out of synthetic resin to support the panel assembly 20, the panel assembly 20 can be more effectively protected from external impact.

In accordance with the present exemplary embodiment, by forming the bezel 40 out of synthetic resin, an improved impact absorption/dispersion effect can be obtained. Furthermore, when the OLED display 100 uses the bezel 40 made out of synthetic resin, an overall weight of the OLED display 100 is reduced. Therefore, when the OLED display 100 using the bezel 40 made out of synthetic resin collides with an external object or is dropped on the floor, impact energy generated thereby is relatively small.

In addition, a thickness of the bezel 40 is designed to vary in accordance with the size of the panel assembly 20 so as to prevent deterioration of a drop impact resistance property even when the size of the panel assembly 20 increases. That is, a thickness t (see FIG. 1) of the bezel 40 increases with the increase of an area of the display region A10 of the panel assembly 20 to enhance the mechanical strength of the bezel 40.

For example, when the OLED display 100 is designed with the display region A10 having a diagonal length d (see FIG. 1) equal to or greater than 25.4 mm (1 inch) but less than 101.6 mm (4 inches), the bezel 40 is designed to satisfy the following inequality 1:

$$t \geq 0.0003 \times a \quad \text{[Inequality 1]}$$

where, t (in mm) is the thickness of the bezel 40 and a (in mm$^2$) is the area of the display region A10. The thickness t of the bezel 40, which is obtained by Inequality 1, is a minimum thickness of bezel 40 that can secure a desirable drop impact resistance property.

Figure 5:
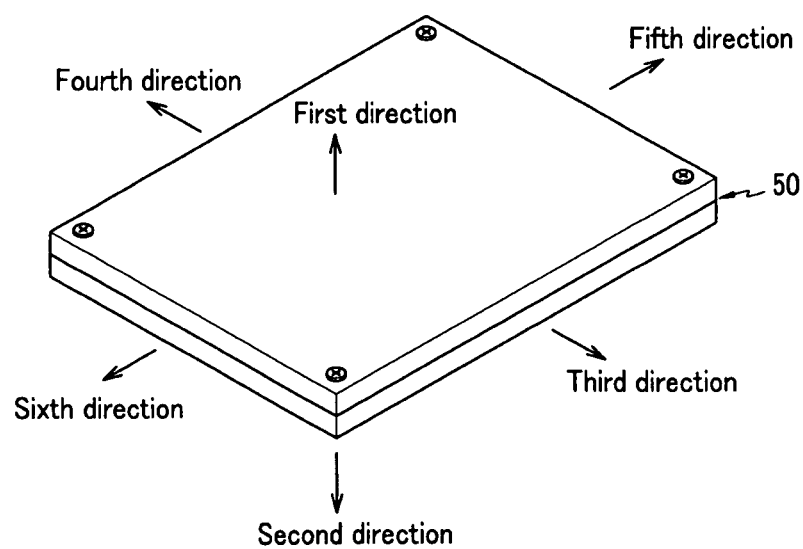
FIG. 5 is a schematic diagram of a drop jig used for a drop impact resistance test.

A test for determining damage to the panel assembly 20 was performed using the drop jig of FIG. 5 with the OLED display 100 within, which is designed with the display region A10 having the diagonal length d equal to or greater than 25.4 mm (1 inch) but less than 101.6 mm (4 inches), to execute a free-fall from a height of 1.5 m.

Turning now to FIG. 5, FIG. 5 is a schematic diagram of a drop jig used for the drop impact resistance test. Referring to FIG. 5, the drop jig 50 includes an upper case and a lower case. The OLED display is mounted within a space defined by the upper and the lower cases of the drop jig 50. The drop jig 50 was dropped in first through sixth directions as indicated by the six arrows of FIG. 5 corresponding to respective sides of the hexahedron drop jig 50.

The drop impact resistance test was performed 18 times (3 times for each of the six directions) for one type of OLED display. The drop impact resistance value was calculated by giving 1 point when the panel assembly was not damaged and by giving 0 points when the panel assembly is damaged. The test was repeatedly performed for 10 different OLED displays. The drop impact resistance values shown in the following Tables 1 to 6 are mean values for the 10 different OLED displays.

First, an OLED display that is designed with a display region having a diagonal length of 45.72 mm (1.8 inch) and an area of 1003.35 mm$^2$ will be described. In this case, a minimum thickness of the bezel according to Inequality 1 is 0.3 mm. Drop impact resistance test results for bezels having various thicknesses are shown in the following Table 1:

TABLE 1

|  | Examples | | | |
| --- | --- | --- | --- | --- |
| Thickness of bezel (mm) | 0.3 | 0.4 | 0.5 | 0.6 |
| Mean drop impact resistance value | 18 | 18 | 18 | 18 |

A possible minimum thickness of the bezel made out of the synthetic resin is 0.3 mm. Table 1 shows that all the examples (4 different OLED displays) having a diagonal length of 45.72 mm and a bezel thickness equal to or greater than 0.3 mm have a mean drop impact resistance value of 18. This means that all the examples have excellent drop impact strength.

An OLED display that is designed with a display region having a diagonal length of 55.88 mm (2.2 inches) and an area of 1498.83 mm$^2$ will be described. In this case, a minimum thickness of the bezel according to Inequality 1 is 0.45 mm. Drop impact resistance test results for bezels having various thicknesses are shown in the following Table 2:

TABLE 2

|  | Comparative Examples | | Examples | | | |
| --- | --- | --- | --- | --- | --- | --- |
| Thickness of bezel (mm) | 0.35 | 0.4 | 0.45 | 0.55 | 0.65 | 0.75 |
| Mean drop impact resistance value | 14 | 16 | 18 | 18 | 18 | 18 |

Next, an OLED display that is designed with a display region having a diagonal length of 71.12 mm (2.8 inches) and an area of 2427.87 mm$^2$ will be described. In this case, a minimum thickness of the bezel according to Inequality 1 is 0.73 mm. Drop impact resistance test results for bezels having various thicknesses are shown in the following Table 3:

TABLE 3

|  | Comparative Examples | | Examples | | | |
| --- | --- | --- | --- | --- | --- | --- |
| Thickness of bezel (mm) | 0.53 | 0.63 | 0.73 | 0.83 | 0.93 | 1.03 |
| Mean drop impact resistance value | 12 | 16 | 18 | 18 | 18 | 18 |

Next, an OLED display that is designed with a display region having a diagonal length of 76.2 mm (3 inches) and an area of 2787.1 mm$^2$ will be described. In this case, a minimum thickness of the bezel according to Inequality 1 is 0.84 mm. Drop impact resistance test results for bezels having various thicknesses are shown in the following Table 4:

TABLE 4

|  | Comparative Examples | | Examples | | | |
| --- | --- | --- | --- | --- | --- | --- |
| Thickness of bezel (mm) | 0.64 | 0.74 | 0.84 | 0.94 | 1.04 | 1.14 |
| Mean drop impact resistance value | 12 | 16 | 18 | 18 | 18 | 18 |

Next, an OLED display that is designed with a display region having a diagonal length of 88.9 mm (3.5 inches) and an area of 3793.54 mm$^2$ will be described. In this case, a minimum thickness of the bezel according to Inequality 1 is 1.14 mm. Drop impact resistance test results for bezels having various thicknesses are shown in the following Table 5:

TABLE 5

|  | Comparative Examples | | Examples | | | |
| --- | --- | --- | --- | --- | --- | --- |
| Thickness of bezel (mm) | 0.94 | 1.04 | 1.14 | 1.24 | 1.34 | 1.44 |
| Mean drop impact resistance value | 13 | 15 | 18 | 18 | 18 | 18 |

Next, an OLED display that is designed with a display region having a diagonal length of 99.06 mm (3.9 inches) and an area of 4710.18 mm² will be described. In this case, a minimum thickness of the bezel according to Inequality 1 is 1.41 mm. Drop impact resistance test results for bezels having various thicknesses are shown in the following Table 6:

TABLE 6

|  | Comparative Examples | | Examples | | | |
| --- | --- | --- | --- | --- | --- | --- |
| Thickness of bezel (mm) | 1.21 | 1.31 | 1.41 | 1.51 | 1.61 | 1.71 |
| Mean drop impact resistance value | 14 | 16 | 18 | 18 | 18 | 18 |

As shown in Tables 1 to 6, when the OLEDs are designed with the display region A10 having a diagonal length equal to or greater than 25.4 mm but less than 101.6 mm have a bezel with a minimum thickness satisfying Inequality 1, the mean drop impact resistance values thereof are 18, which means that the impact strength is excellent.

Meanwhile, as the thickness of the bezel 40 increases, an overall thickness of the OLED display 100 increases. This makes it difficult to make the OLED display slim. An allowable maximum thickness of the bezel 40 for a slim mobile device in accordance with variation of the diagonal length of the display region is shown in the following Table 7:

TABLE 7

| Diagonal Length of Display Region (mm) | Allowable Maximum Thickness of Bezel (mm) |
| --- | --- |
| 45.72 | 1 |
| 55.88 | 1.2 |
| 71.12 | 1.5 |
| 76.2 | 1.8 |
| 88.9 | 2 |
| 99.06 | 2.5 |

Optimal thickness ranges of the bezels having various display region sizes can be represented as shown in the following Table 8 in accordance with Inequality 1 and results of Table 7:

TABLE 8

| Diagonal Length of Display Region (mm) | Optimal Thickness of Bezel (mm) |
| --- | --- |
| 45.72 | 0.3~1 |
| 55.88 | 0.45~1.2 |
| 71.12 | 0.73~1.5 |
| 76.2 | 0.84~1.8 |
| 88.9 | 1.14~2 |
| 99.06 | 1.41~2.5 |

Next, when the OLED display 100 is designed with the display region A10 having a diagonal length d equal to or greater than 101.6 mm (4 inches) but less than 177.8 mm (7 inches), the bezel 40 is designed to satisfy the following Inequality 2:

$$t \geq 0.00024 \times a \quad \text{[Inequality 2]}$$

where, t(mm) is the thickness of the bezel 40 and a(mm²) is the area of the display region A10. The thickness t of the bezel 40, which is obtained by Inequality 2, is a minimum thickness the bezel 40 that can secure a desirable drop impact resistance property.

A test for determining damage of the panel assembly 20 was performed by allowing the drop jig of FIG. 5 with the OLED display 100 within, which is designed with the display region A10 having the diagonal length d equal to or greater than 101.6 mm but less than 177.8 mm, to execute a free-fall from a height of 1.2 m. Except for this change in drop height, this drop impact resistance test was the same as that performed to produce the results of tables 1-6 above.

First, an OLED display that is designed with a display region having a diagonal length of 101.6 ml (4 inches) and an area of 4954.83 mm² will be described. In this case, a minimum thickness of the bezel according to Inequality 2 is 1.19 mm. Drop impact resistance test results for bezels having various thicknesses are shown in the following Table 9:

TABLE 9

|  | Comparative Examples | | Examples | | | |
| --- | --- | --- | --- | --- | --- | --- |
| Thickness of bezel (mm) | 0.99 | 1.09 | 1.19 | 1.29 | 1.39 | 1.49 |
| Mean drop impact resistance value | 12 | 15 | 18 | 18 | 18 | 18 |

Next, an OLED display that is designed with a display region having a diagonal length of 127 mm (5 inches) and an area of 7741.92 mm² will be described. In this case, a minimum thickness of the bezel according to Inequality 2 is 1.86 mm. Drop impact resistance test results for bezels having various thicknesses are shown in the following Table 10:

TABLE 10

|  | Comparative Examples | | Examples | | | |
| --- | --- | --- | --- | --- | --- | --- |
| Thickness of bezel (mm) | 1.66 | 1.76 | 1.86 | 1.96 | 2.06 | 2.16 |
| Mean drop impact resistance value | 13 | 16 | 18 | 18 | 18 | 18 |

Next, an OLED display that is designed with a display region having a diagonal length of 152.4 mm (6 inches) and an area of 11148.36 mm² will be described. In this case, a minimum thickness of the bezel according to Inequality 2 is 2.67 mm. Drop impact resistance test results for bezels having various thicknesses are shown in the following Table 11:

TABLE 11

|  | Comparative Examples | | Examples | | | |
| --- | --- | --- | --- | --- | --- | --- |
| Thickness of bezel (mm) | 2.48 | 2.57 | 2.67 | 2.77 | 2.87 | 2.97 |
| Mean drop impact resistance value | 14 | 16 | 18 | 18 | 18 | 18 |

As shown in Tables 8 to 10, when the OLEDs that are designed with the display region A10 having a diagonal length equal to or greater than 101.6 mm but less than 177.8 mm have a bezel with a minimum thickness satisfying Inequality 2, the mean drop impact resistance values thereof are 18, which means that the impact strength is excellent.

Meanwhile, as the thickness of the bezel 40 increases, an overall thickness of the OLED display 100 increases. This makes it difficult to make the OLED display slim. An allowable maximum thickness of the bezel 40 for a slim mobile device (e.g., a personal multimedia player (PMP)) in accordance with variation of the diagonal length of the display region is shown in the following Table 12:

TABLE 12

| Diagonal Length of Display Region (mm) | Allowable Maximum Thickness of Bezel (mm) |
|---|---|
| 101.6 | 3 |
| 127 | 4 |
| 152.4 | 5 |

Optimal thickness ranges of the bezels having various display region diagonal lengths can be represented as shown in the following Table 13 in accordance with Inequality 2 and results of Table 12:

TABLE 13

| Diagonal Length of Display Region (mm) | Optimal Thickness of Bezel (mm) |
|---|---|
| 101.6 | 1.19~3 |
| 127 | 1.86~4 |
| 152.4 | 2.67~5 |

Next, when the OLED display 100 is designed with the display region A10 having a diagonal length d equal to or greater than 177.8 mm (7 inches), the bezel 40 is designed to satisfy the following inequality 3.

$$t \geq 0.00015 \times a \quad \text{[Inequality 3]}$$

where, t(mm) is the thickness of the bezel 40 and a(mm$^2$) is the area of the display region A10. The thickness t of the bezel 40, which is obtained by Inequality 3, is a minimum thickness of the bezel 40 that can secure a desirable drop impact resistance property.

A test for determining damage of the panel assembly 20 was performed by allowing the drop jig of FIG. 5 with the OLED display 100 arranged within, which is designed with the display region A10 having the diagonal length d equal to or greater than 177.8 mm, to execute a free-fall from a height of 75 cm. Except for the change in drop height, the drop impact resistance test was identical to that performed for tables 9 through 11 above.

First, an OLED display that is designed with a display region having a diagonal length of 177.8 mm (7 inches) and an area of 15174.16 mm$^2$ will be described. In this case, a minimum thickness of the bezel according to Inequality 3 is 2.27 mm. Drop impact resistance test results for bezels having various thicknesses are shown in the following Table 14:

TABLE 14

| | Comparative Examples | | Examples | | | |
|---|---|---|---|---|---|---|
| Thickness of bezel (mm) | 2.07 | 2.17 | 2.27 | 2.37 | 2.47 | 2.57 |
| Mean drop impact resistance value | 14 | 17 | 18 | 18 | 18 | 18 |

Next, an OLED display that is designed with a display region having a diagonal length of 203.2 mm (8 inches) and an area of 19819.32 mm$^2$ will be described. In this case, a minimum thickness of the bezel according to Inequality 3 is 2.97 mm. Drop impact resistance test results for bezels having various thicknesses are shown in the following Table 15:

TABLE 15

| | Comparative Examples | | Examples | | | |
|---|---|---|---|---|---|---|
| Thickness of bezel (mm) | 2.77 | 2.87 | 2.97 | 3.07 | 3.17 | 3.27 |
| Mean drop impact resistance value | 14 | 16 | 18 | 18 | 18 | 18 |

As shown in Tables 14 and 15, when the OLEDs are designed with the display region A10 having a diagonal length equal to or greater than 177.8 mm have a bezel with a minimum thickness satisfying Inequality 3, the mean drop impact resistance values thereof are 18, which means that the impact strength is excellent.

Meanwhile, as the thickness of the bezel 40 increases, an overall thickness of the OLED display 100 increases. This makes it difficult to making the OLED display slim. An allowable maximum thickness of the bezel 40 for a wall-mountable display device in accordance with variation of the diagonal length of the display region is shown in the following Table 16:

TABLE 16

| Diagonal Length of Display Region (mm) | Allowable Maximum Thickness of Bezel (mm) |
|---|---|
| 177.8 | 5 |
| 203.2 | 6 |

Optimal thickness ranges of the bezels having various display region diagonal lengths can be represented as shown in the following Table 17 in accordance with Inequality 3 and results of Table 16:

TABLE 17

| Diagonal Length of Display Region (mm) | Optimal Thickness of Bezel (mm) |
|---|---|
| 177.8 | 2.27~5 |
| 203.2 | 2.97~6 |

According to the present exemplary embodiment, since the bezel 40 of the OLED display 100 is made out of synthetic resin and the thickness of the bezel 40 increases in proportion to the area of the display region A10, the reliability of the drop impact resistance can be securely maintained even when the OLED display is designed to have a relatively large display size.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
   a panel assembly that includes a display region, a pad region, and a plurality of OLEDs arranged in the display region; and a bezel coupled to the panel assembly, the bezel including synthetic resin, a thickness of the bezel being related to greater than or equal to 0.03% of an area of the display region, when a diagonal length of the display region is in the range of 25.4 to 101.6 mm.

2. The OLED display of claim 1, wherein the diagonal length of the display region is 45.72 mm and the thickness of the bezel is between 0.3 and 1 mm.

3. The OLED display of claim 1, wherein the diagonal length of the display region is 55.88 mm and the thickness of the bezel is between 0.45 and 1.2 mm.

4. The OLED display of claim 1, wherein the diagonal length of the display region is 71.12 mm and the thickness of the bezel is between 0.73 and 1.5 mm.

5. The OLED display of claim 1, wherein the diagonal length of the display region is 76.2 mm and the thickness of the bezel is between 0.84 and 1.8 mm.

6. The OLED display of claim 1, wherein the diagonal length of the display region is 88.9 mm and the thickness of the bezel is between 1.14 and 2 mm.

7. The OLED display of claim 1, wherein the diagonal length of the display region is 99.06 mm and the thickness of the bezel is between 1.41 and 2.5 mm.

8. The OLED display of claim 1, wherein the bezel comprises:
   a bottom portion, the panel assembly being arranged on the bottom portion; and
   sidewalls arranged on side edges of the bottom portion except for a side edge corresponding to the pad region.

9. The OLED display of claim 8, further comprising:
   a flexible printed circuit board fixed to the pad region and bent toward a rear surface of the bezel; and
   a printed circuit board electrically connected to the panel assembly by the flexible printed circuit board.

10. An organic light emitting diode (OLED) display, comprising:
    a panel assembly including a display region, a pad region, and a plurality of OLEDs arranged in the display region; and
    a bezel coupled to the panel assembly, the bezel including synthetic resin, a thickness of the bezel being related to greater than or equal to 0.024% of an area of the display region, when a diagonal length of the display region is in the range of 101.6 to 177.8 mm.

11. The OLED display of claim 10, wherein the diagonal length of the display region is 101.6 mm and the thickness of the bezel is between 1.19 and 3 mm.

12. The OLED display of claim 10, wherein the diagonal length of the display region is 127 mm and the thickness of the bezel is between 1.86 and 4 mm.

13. The OLED display of claim 10, wherein the diagonal length of the display region is 152.4 mm and the thickness of the bezel is between 2.67 and 5 mm.

14. The OLED display of claim 10, wherein the bezel comprises:
    a bottom portion, the panel assembly being arranged on the bottom portion; and
    sidewalls arranged on side edges of the bottom portion except for a side edge corresponding to the pad region.

15. The OLED display of claim 14, further comprising:
    a flexible printed circuit board fixed to the pad region and bent toward a rear surface of the bezel; and
    a printed circuit board electrically connected to the panel assembly by the flexible printed circuit board.

16. An organic light emitting diode (OLED) display, comprising:
    a panel assembly that includes a display region, a pad region, and a plurality of OLEDs arranged in the display region; and
    a bezel coupled to the panel assembly, the bezel including synthetic resin, a thickness of the bezel being related to greater than or equal to 0.015% of an area of the display region, when a diagonal length of the display region at least 177.8 mm.

17. The OLED display of claim 16, wherein the diagonal length of the display region is 177.8 mm and the thickness of the bezel is between 2.27 and 5 mm.

18. The OLED display of claim 16, wherein the diagonal length of the display region is 203.2 mm and the thickness of the bezel is between 2.97 and 6 mm.

19. The OLED display of claim 16, wherein the bezel comprises:
    a bottom portion, the panel assembly being arranged on the bottom portion; and
    sidewalls arranged on side edges of the bottom portion except for a side edge corresponding to the pad region.

20. The OLED display of claim 19, further comprising:
    a flexible printed circuit board fixed to the pad region and bent toward a rear surface of the bezel; and
    a printed circuit board electrically connected to the panel assembly by the flexible printed circuit board.

* * * * *